United States Patent
Clevenger et al.

(10) Patent No.: US 7,052,937 B2
(45) Date of Patent: May 30, 2006

(54) METHOD AND STRUCTURE FOR PROVIDING IMPROVED THERMAL CONDUCTION FOR SILICON SEMICONDUCTOR DEVICES

(75) Inventors: Lawrence A. Clevenger, LeGrangeville, NY (US); Louis L. Hsu, Fishkill, NY (US); Li-Kong Wang, Montvale, NJ (US); Tsorng-Dih Yuan, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/429,758

(22) Filed: May 5, 2003

(65) Prior Publication Data
US 2003/0189231 A1 Oct. 9, 2003

Related U.S. Application Data

(62) Division of application No. 09/362,399, filed on Jul. 28, 1999, now Pat. No. 6,573,565.

(51) Int. Cl.
*H01L 21/44* (2006.01)

(52) U.S. Cl. ............... 438/122; 438/105; 257/717; 257/720

(58) Field of Classification Search ............... 257/355, 257/77, 276, 214, 280, 705, E23.051, 720, 257/622, 625; 438/214, 280, 411, 619, 122, 438/221, 435, 102
See application file for complete search history.

(56) References Cited

U.S. PATENT DOCUMENTS 3,840,451 A * 10/1974 Golyanov et al. ..... 204/192.15
5,131,963 A * 7/1992 Ravi .................. 148/33.3
5,221,870 A * 6/1993 Nakahata et al. ....... 310/313 A
5,276,338 A * 1/1994 Beyer et al. .............. 257/52
5,278,430 A * 1/1994 Kakumu ................ 257/77
5,313,094 A * 5/1994 Beyer et al. ............. 257/622
5,523,588 A * 6/1996 Nishimura et al. .......... 257/77
5,569,620 A * 10/1996 Linn et al. ............. 438/406
5,573,973 A * 11/1996 Sethi et al. ............. 438/386
5,679,269 A * 10/1997 Cohen et al. ............ 216/72
5,683,939 A * 11/1997 Schrantz et al. .......... 438/384
5,744,865 A * 4/1998 Jeng et al. ............. 257/750
5,955,781 A * 9/1999 Joshi et al. ............. 257/712

(Continued)

*Primary Examiner*—Long Pham
*Assistant Examiner*—Thao X. Le
(74) *Attorney, Agent, or Firm*—Robert M. Trepp; Anne Vachon Dougherty (57) ABSTRACT

Thermal cooling structures of diamond or diamond-like materials are provided for conducting heat away from semiconductor devices. A first silicon-on-insulator embodiment comprises a plurality of thermal paths, formed after shallow trench and device fabrication steps are completed, which extend through the buried oxide and provide heat dissipation through to the underlying bulk silicon substrate. The thermal conduction path material is preferably diamond which has high thermal conductivity with low electrical conductivity. A second diamond trench cooling structure, formed after device fabrication has been completed, comprises diamond shallow trenches disposed between the devices and extending through the buried oxide layer. An alternative diamond thermal cooling structure includes a diamond insulation layer deposited over the semiconductor devices in either an SOI or bulk silicon structure. Yet another embodiment comprises diamond sidewalls formed along the device walls in thermal contact with the device junctions to provide heat dissipation through the device junctions to underlying cooling structures. It is also proposed that the foregoing structures, and combinations of the foregoing structures, could be used in conjunction with other known cooling schemes.

13 Claims, 7 Drawing Sheets

U.S. PATENT DOCUMENTS 5,977,609 A * 11/1999 Soderbarg et al. .......... 257/510
5,990,493 A * 11/1999 Gardner et al. ............... 257/77
6,100,199 A *  8/2000 Joshi et al. ................. 438/694
6,121,661 A *  9/2000 Assaderaghi et al. ....... 257/355
6,136,700 A * 10/2000 McAnally et al. .......... 438/666
6,222,254 B1 *  4/2001 Liang et al. ................. 257/622
6,271,594 B1 *  8/2001 Matsubara .................. 257/760

* cited by examiner

METHOD AND STRUCTURE FOR PROVIDING IMPROVED THERMAL CONDUCTION FOR SILICON SEMICONDUCTOR DEVICES

This is a division of application Ser. No. 09/362,399, filed Jul. 28, 1999 now U.S. Pat. No. 6,573,565.

FIELD OF THE INVENTION

This invention relates to semiconductor device cooling and, more particularly, to a method and structure for providing CVD diamond thermal conduction structures for semiconductor devices.

BACKGROUND OF THE INVENTION

Semiconductor chips require cooling to sustain reliability of circuits and interconnects formed on and in the semiconductor chips, to optimize circuit switching performance, and to suppress thermally generated noise in the circuits. An increased need for thermal cooling is seen for CMOS transistors, wherein high temperatures yield significantly larger leakage currents due to thermal generation of carriers. Moreover, as device dimensions decrease, leakage current grows exponentially.

As a result, a myriad of cooling structures have been devised for incorporation into the semiconductor chip structure itself and for use with semiconductor chip structures. Cooling may be provided for an entire circuit boards may be applied selectively to individual chips, or may be provided on-chip to dissipate heat from individual hot spots within a chip. Examples of some prior art cooling solutions include U.S. Pat. No. 5,621,616 of A. H. Owens, wherein a high conductivity thermal transfer pathway is created, using multiple metal layers and vias, to draw heat away from the bulk silicon semiconductor substrate. Owens additionally proposes embedding metal plugs into a chip substrate to collect heat generated by transistors and remove the heat through metal interconnects in the chips.

Silicon-on-insulator (SOI) structures for CMOS devices have been developed as an alternative to the bulk silicon device technology for very large scale integration (VLSI) circuits. The SOI structures are preferable due to the advantages provided by the buried oxide (BOX) insulator layer. The BOX advantages include an absence of the reverse body effect, absence of latch-up, soft error immunity, and elimination of the parasitic junction capacitance typically encountered in bulk silicon devices. Reduction of the parasitic capacitance allows for greater circuit density, operation at higher circuit speeds, and reduced power consumption.

Figure 1:
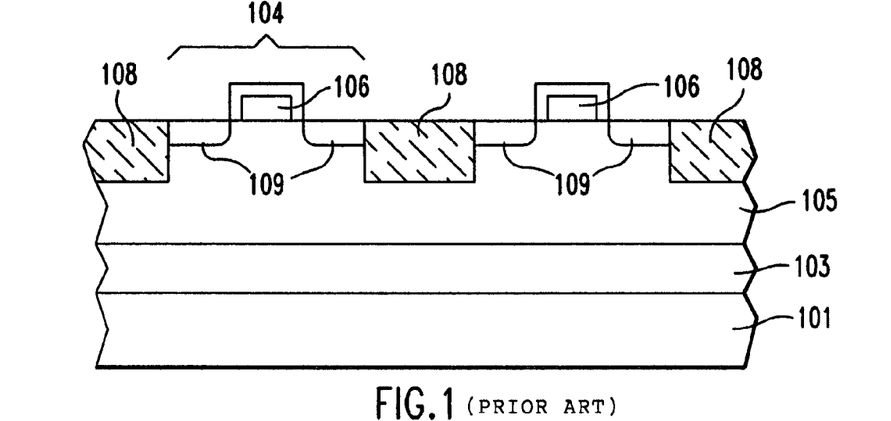
FIG. 1 provides a schematic illustration of a typical prior art SOI structure.

FIG. 1 illustrates a typical SOI CMOS structure wherein buried oxide (BOX) layer 103, generally about 0.1–0.5 microns in thickness, is provided in the substrate 101, which comprises 400–600 microns of silicon. For the sake of illustration, silicon-on-oxide (SOI) layer 105 is shown as a p-type silicon substrate having a thickness of about 0.2–1 μm, with an NMOSFET device 104 formed at the surface. Clearly, the ensuing description of both the background and the novel structure and method will be equally applicable to devices formed in an n-type SOI silicon substrate. The NMOSFET device 104, formed in the SOI layer above the buried oxide layer, comprises polysilicon gate 106 and source and drain regions 109. Adjacent NMOSFET devices are both physically and electrically isolated from each other by shallow trench regions 108, typically comprised of an oxide region.

While SOI structures are advantageous for reduction of parasitic capacitance otherwise associated with bulk silicon CMOS devices, there are disadvantages to the isolation provided by the buried oxide layer. With the isolation provided by the buried oxide, the devices cannot dissipate heat to the 400–600 micron silicon substrate, as efficiently as devices formed on bulk silicon had allowed, since the BOX is a thermal barrier.

One structure which has been proposed for SOI cooling is presented in U.S. patent application Ser. No. 08/822,440, entitled "Silicon-On-Insulator Structure for Electrostatic Discharge Protection and Improved Heat Dissipation" which was filed on Mar. 21, 1997 and is assigned to the present assignee. In that application, the contents of which are incorporated by reference herein, thermally conductive plugs are formed passing through the buried oxide region and into the opposite type silicon substrate. The plugs, preferably comprising polysilicon, are in contact with the sources and drains of the CMOS devices to provide paths for dissipating positive and negative ESD stresses, in addition to providing thermal dissipation pathways for directing heat away from the circuitry.

Yet another proposed solution is found in U.S. patent application Ser. No. 09/006,575, of Joshi, et al, entitled "Embedded Thermal Conductors for Semiconductor Chips", filed on Jan. 13, 1998 and currently under allowance, and its divisional case Ser. No. 09/296,846 filed Apr. 22, 1999, both of which are assigned to the present assignee. In accordance with the teachings of those applications, the contents of which are incorporated by reference herein, back-side diamond thermal paths are provided effectively to act as cooling fins; or alternatively, front-side shallow trench diamond thermal conductors are provided in contact with the devices at the substrate surface and extend through the BOX layer to contact the underlying bulk silicon. The shallow trench diamond structures provide both electrical isolation between devices and thermal conduction of heat away from the devices. A disadvantage to the former Joshi structure is that back-side cooling does nothing for dissipating heat away from the front-side-mounted devices. A disadvantage to the latter Joshi front-side structure and method is that the trenches are formed prior to device fabrication. As a result, the diamond in the trenches must be recessed and covered to protect it from the subsequent processing steps; thereby requiring numerous additional processing steps and resulting in an unusual structural profile.

It is therefore an objective of the present invention to provide improved cooling through thermal conduction structures for semiconductor devices.

It is additionally an objective of the invention to provide a method for creating thermal conduction paths for SOI devices on the front side of the wafer.

Yet another objective of the invention is to provide a method for incorporating thermal conduction paths into SOI structures which is compatible with currently-used SOI fabrication processes.

SUMMARY OF THE INVENTION

These and other objectives are realized by the present invention including a first silicon-on-insulator embodiment which comprises a plurality of thermal paths, formed after shallow trench and device fabrication steps are completed, which extend through the buried oxide and provide heat dissipation through to the underlying bulk silicon substrate. The thermal conduction path material is preferably diamond which has high thermal conductivity with low electrical conductivity. A second diamond trench cooling structure, formed after device fabrication has been completed, comprises diamond shallow trenches disposed between the devices and extending through the buried oxide layer. Similar diamond trench structures can be implemented when forming semiconductors in bulk silicon. An alternative diamond thermal cooling structure includes a diamond insulation layer deposited over the semiconductor devices. For transistors, yet another embodiment comprises diamond sidewalls formed along the gate walls in thermal contact with the device junctions to provide heat dissipation through the device junctions to underlying cooling structures. Diamond sidewalls may also be used for channeling heat from other semiconductor devices and from interconnect wiring disposed at the substrate surface. It is also proposed that the foregoing structures, and combinations of the foregoing structures, could be used in conjunction with other known cooling schemes such as the backside diamond cooling fins taught by the aforementioned Joshi, et al patent and patent application.

BRIEF DESCRIPTION OF THE DRAWINGS

The present invention will be detailed with specific reference to the appended drawings of which.

DESCRIPTION OF THE PREFERRED EMBODIMENT

The present invention provides semiconductor cooling structures which are superior to those found in the prior art. The cooling structures include a first embodiment comprising thermal conduction paths formed in a silicon-on-insulator (SOI) structure having a buried oxide (BOX) layer, where the thermal conduction paths are formed between the shallow trench layers which isolate device and extend through the BOX layer to contact the underlying silicon. A second implementation of the invention provides for formation of diamond shallow trench regions between devices after device fabrication has been completed, either on an SOI or a bulk silicon structure. Under such an embodiment, more effective thermal conduction paths can be provided in the shallow trenches since the diamond would not require silicon nitride and oxide overlayers to protect it from subsequent thermal oxidation steps. Another embodiment includes a planar, thermally conductive insulation layer disposed over the completed device structures and having openings for device contact. The thermally conductive insulation layer can laterally direct heat away from the devices and toward cooling structures. Yet another implementation comprises thermally conductive sidewall spacers are provided along the vertical sides of devices, metal wiring and/or metal vias to provide heat dissipation. The sidewall spacer embodiment is preferably implemented on a bulk silicon structure, but may also be used on an SOI structure, preferably in conjunction with another cooling means.

All of the foregoing thermal conductors are preferably fabricated of diamond or diamond-like materials, for example diamond-like carbon or silicon carbide (hereinafter collectivley referred to as "diamond"). Diamond has a high thermal conductivity, which is more than 14 times that of silicon, and is an electrical insulator. Diamond also adheres well to silicon. The properties of chemical vapor deposited (CVD) diamond are given in Table 1, as compared to those properties for silicon and silicon dioxide:

TABLE I

| | MATERIAL | | |
| --- | --- | --- | --- |
| PROPERTIES | Diamond | Silicon | Silicon Dioxide |
| Thermal conductivity (W/m-K) | 1000–2000 | 110–150 | 0.1 to 1.5 |
| Dielectric constant | 5.7 | — | 3.9 |
| (CTE) TCE ($\times 10^{-6}$ cm/° C. | 2.8 | 3.5 | 0.55 |

As taught in the aforementioned Joshi, et al patent applications, a hot wall filament chemical vapor deposition system may be used to process diamond to create films. Diamond films may be deposited using a gas mixture of $CH_4$ and $H_2$ under high pressure, for example 30–40 Torr, varying the temperature from 600–1100° C. The gas mixture may include about 10–30% volume $CH_4$ and about 70–90% $H_2$, although other gases may be present.

While diamond layers can be blanket deposited and subsequently etched using reactive ion etching, the features or depressions in Si or $SiO_2$ contribute to defects which form good nucleation sites for deposited diamond. Surfaces having defects act as nucleation sites whereby the deposition can be selective with respect to surfaces having no defect areas. Therefore, the CVD diamond filling of an opening may start at the bottom or corners of trenches, as these areas form nuclei with lower free energy of formation.

Alternative methods for depositing polycrystalline diamond on single crystalline silicon include a microwave plasma system, an RF plasma system which is inductively or capacitively coupled, and a direct current plasma system. U.S. Pat. No. 4,981,818 provides teachings relating to the tuning or matching of networks required for electrically coupling electrical energy to generated plasma when depositing diamond using either the RF or microwave plasma systems. European patent application 286396 additionally provides examples of methods for growing polycrystalline diamond on top of single crystal silicon.

FIG. 1, as discussed above, illustrates one embodiment of circuitry fabricated using silicon-on-insulator (SOI) technology, for which the cooling can be greatly improved by the present invention. For example, the n-type MOSFET devices 104 of FIG. 1, comprised of gates 106 and source and drain regions 109, are isolated from the bulk silicon substrate 101 by the buried oxide layer 103 and are isolated from each other by the shallow trench regions 108. The features which provide advantages to the SOI configuration over bulk devices, such as the superior isolation from parasitic capacitance from the bulk silicon, also give rise to disadvantages, such as lack of an efficient conduction path for dissipation of power and heat from the device regions to the substrate.

Figure 2:
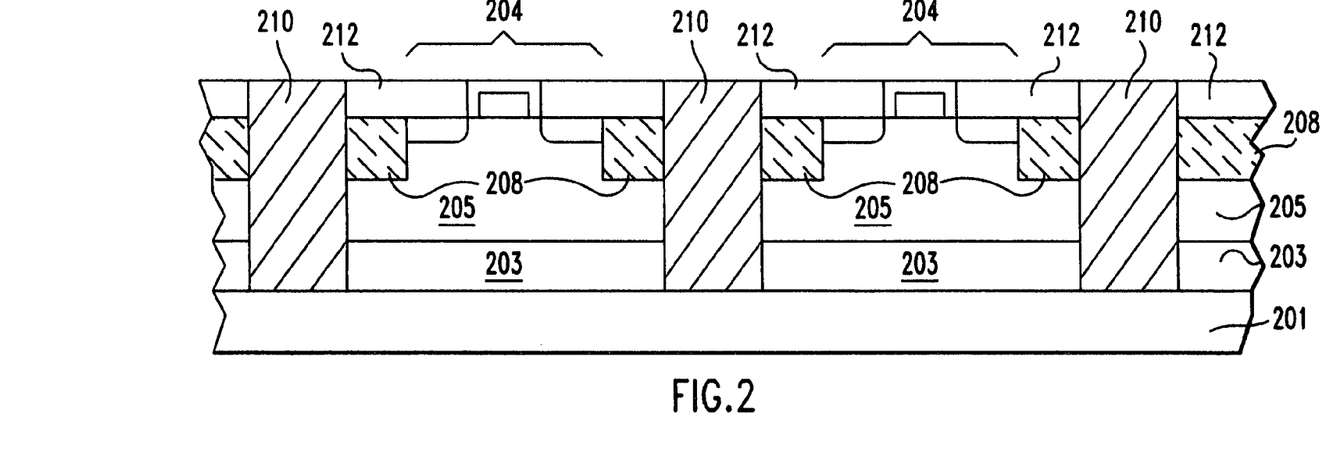
FIG. 2 illustrates a proposed CVD diamond thermal path structure for SOI applications in accordance with the present invention.

FIG. 2 illustrates a proposed CVD diamond thermal path structure for SOI applications in accordance with the present invention. Silicon substrate 201 has a buried oxide layer (BOX) 203 formed therein, with silicon layer 205 disposed over the BOX layer. Dielectric-filled shallow trenches 208 are formed in silicon layer 205, with devices 204 formed in the silicon layer 205 between the shallow trenches 208, and dielectric layer 212 formed at the surface, in accordance with the prior art. Under the present invention, diamond thermal conduction paths 210 are formed between the shallow trench regions 208 and extend through the silicon layer 205 and through the BOX layer 203 to contact the underlying silicon of substrate 201. Heat generated by devices 204 will be conducted away from the devices through the diamond paths 210 to the underlying bulk silicon, which may include additional cooling structures (not shown) for cooling. It is to be noted that the thermal conduction paths will also conduct trapped heat from the silicon layer 205 and heat generated by wiring located at the semiconductor structure surface. As one alternative to the illustrated structure, diamond may be used to fill the shallow trench regions between devices formed in either a bulk silicon or SOI substrate, alone or in conjunction with the diamond-filled deep trenches of FIG. 2.

Figure 3A:
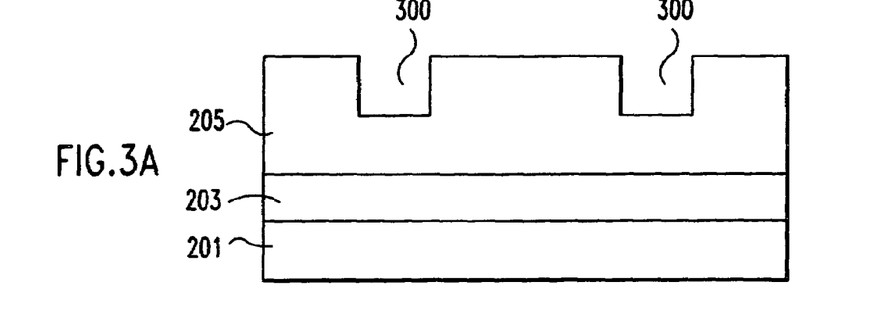
FIGS. 3A through 3G show processing steps for fabricating the structure of FIG. 2.
Figure 3B:
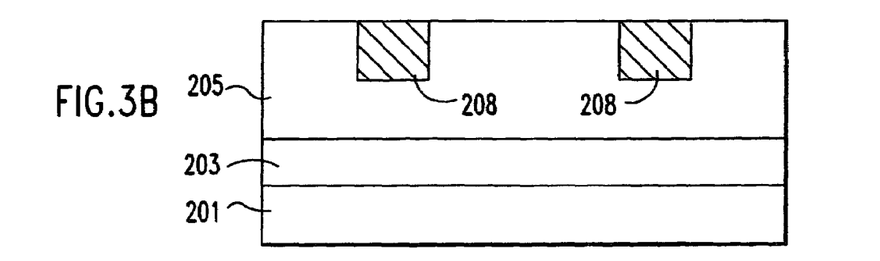
Figure 3C:
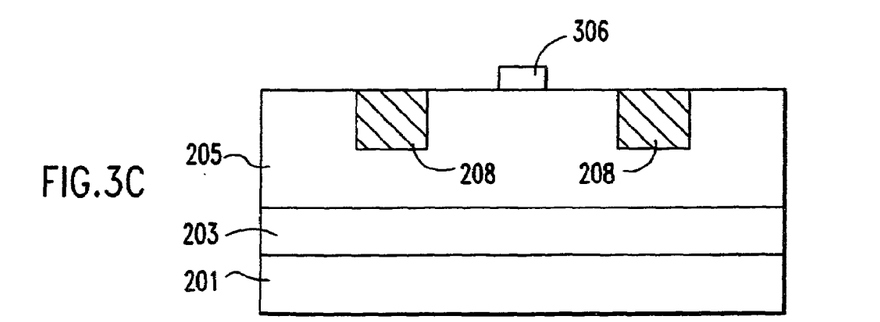
Figure 3D:
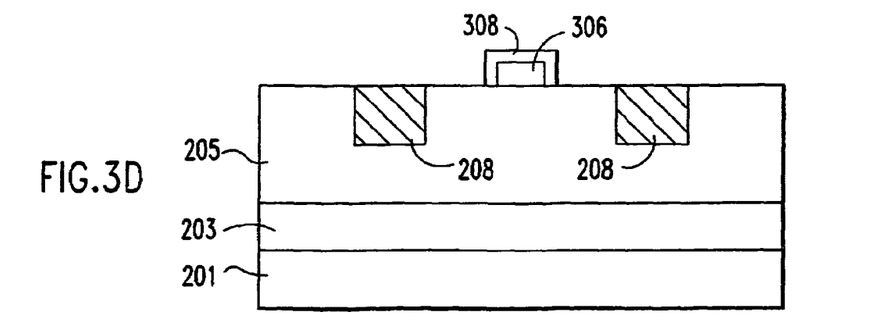
Figure 3E:
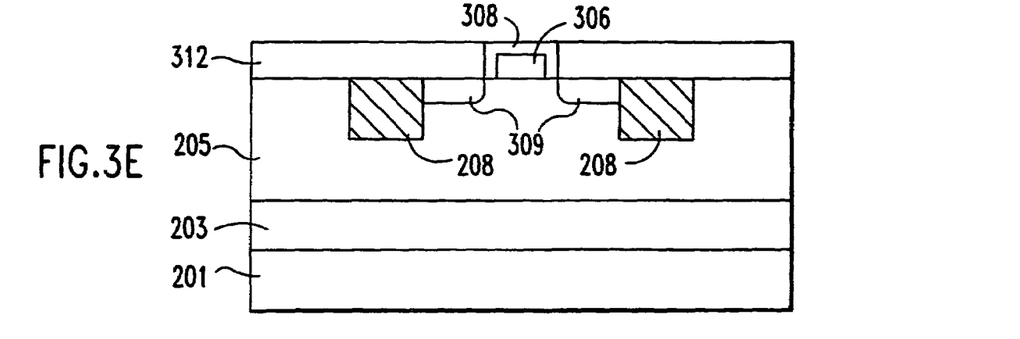
Figure 3F:
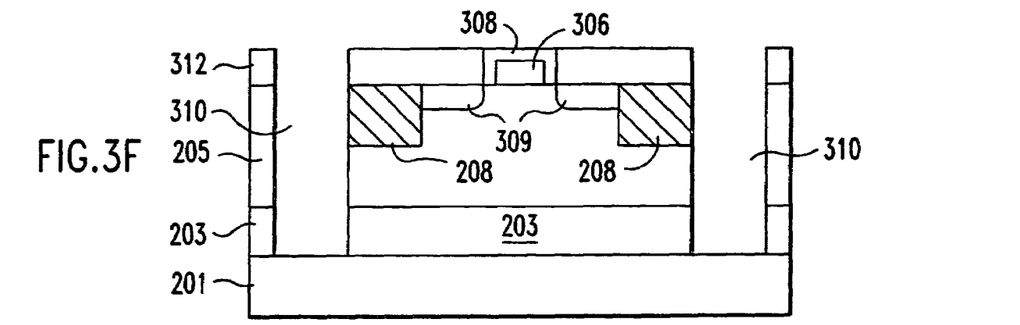
Figure 3G:
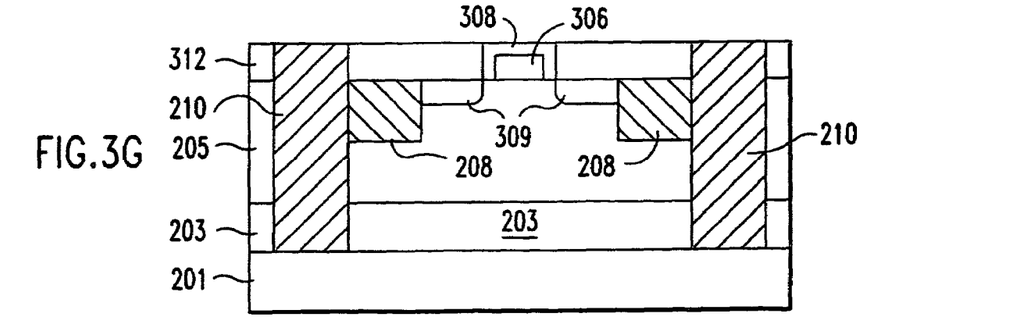

FIGS. 3A through 3G show processing steps for fabricating the structure of FIG. 2. In FIG. 3A, silicon substrate 201 is shown including BOX layer 203 and silicon layer 205 which is etched to provide shallow trench openings 300. As shown in FIG. 3B the shallow trench openings 300 are filled with an appropriate dielectric to form shallow trenches 208 which provide electrical isolation between adjacent devices which are to be formed. The fabrication of device 204 is shown in FIGS. 3C through 3E, including formation of gate 306, masking of gate 306 with layer 308 to protect the gate from the next stage of processing, and implantation of dopants to form source and drain regions 309 in silicon layer 205 adjacent to and contacting gate 306. After the devices have been fabricated, a dielectric layer 312 such as CVD oxide or doped glass is deposited and planarized. As shown in FIG. 3F, openings 310 for the thermal conduction paths are etched through dielectric layer 312, through silicon layer 205, and through the BOX layer 203, to contact the underlying silicon of 201. It is preferable to overetch the openings into the silicon to ensure that all of the BOX layer is removed in the openings 310. Thereafter, the openings 310 are filled to form the thermal conduction paths 210. Diamond or other diamond like substances, as discussed above, are recommended for formation of the thermal conduction paths 210, due to their superior thermal conductivity and low electrical conductivity. If diamond is to be deposited, then a thermal oxidation step should be carried out after etching of the openings 310. The oxide will prevent direct contact between the diamond and the active device areas, thereby preventing unwanted effects such as out-gassing, adhesion failure, etc. Hot filament CVD using a gas mixture of methane ($CH_4$) and hydrogen ($H_2$) under high pressure, or one of the other methods mentioned above, is used to form the diamond thermal conduction paths 210 as shown in the finished structure of FIG. 3G. If needed, excess diamond material is removed by chemical-mechanical polishing or by plasma etching in a reactive ion etching environment with oxygen using silicon oxide/nitride hard masks to protect the diamond in the trenches.

Figure 4:
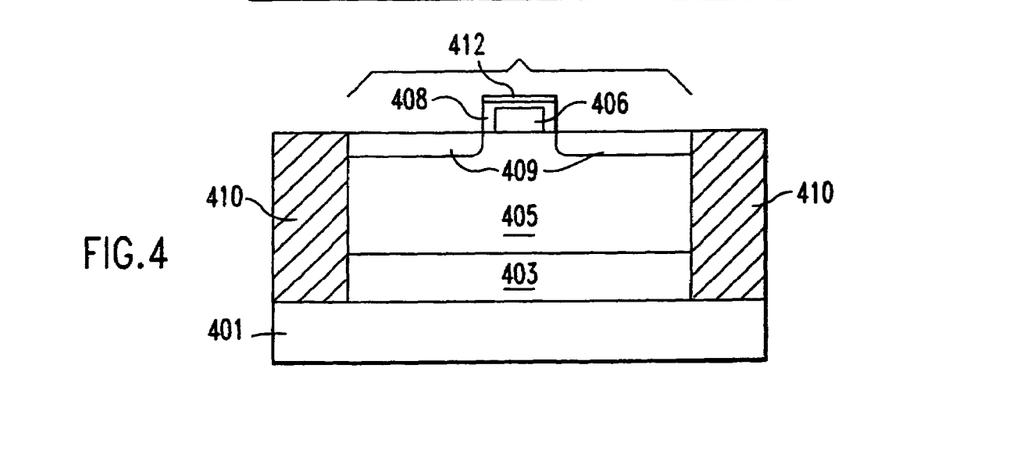
FIG. 4 illustrates an embodiment of the present invention comprising diamond filled shallow trench regions between devices.

The foregoing process may be modified to provide an alternative embodiment of the invention, as illustrated in FIG. 4. Under the inventive method, prior to device fabrication the areas in which shallow trenches are to be formed are masked. The masking may be done by depositing and patterning a layer, such as CVD silicon nitride or oxynitride. Alternatively, shallow trenches may be formed and filled with CVD oxide which will be removed in a later step and replaced with diamond. Device fabrication proceeds as above, with formation of device 406 including the steps of deposition of the gate 408 and implantation of the source and drain regions 409 in silicon layer 405. After device fabrication has been completed, the material in the shallow trench areas is removed using a mask, while gate 408 is protected by a protective film 412 (e.g., nitride). The shallow trench openings are etched completely through the silicon layer 405 and BOX layer 403 to contact the underlying silicon 401, with overetching into the silicon as a preferred step. Thereafter, the shallow trench openings are filled by deposition of diamond or diamond-like material, as above, to form the shallow trenches 410 which will carry heat from the abutting devices, through the silicon and BOX layers to be dissipated in the underlying bulk silicon. While the cited Joshi, et al patent and patent application teach the use of diamond in shallow trenches, the Joshi, et al method requires that the diamond in the shallow trenches be covered by silicon nitride and oxide layers in order to protect the diamond from subsequent gate oxidation. As a result, the Joshi, et al structure is less than optimal since the nitride and oxide compromise the thermal conductivity of the structure. By the present inventive method, an inventive structure is realized wherein the shallow trench is completely filled with diamond for superior thermal conductivity. A thermal analysis is provided below with reference to FIGS. 8A and 8B.

Figure 5:
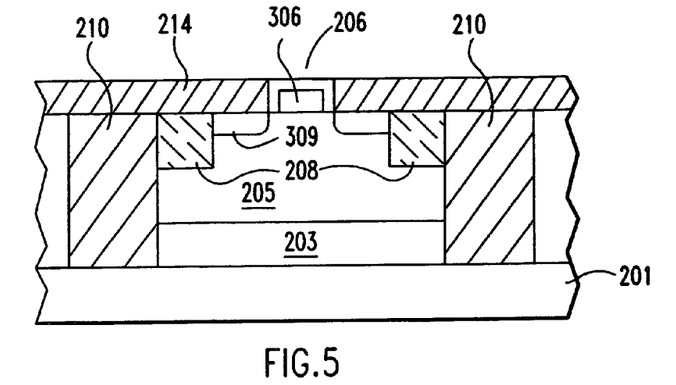
FIG. 5 illustrates the semiconductor structure of FIG. 2 further including a diamond insulation layer as taught by the present invention.

FIG. 5 illustrates the semiconductor structure of FIG. 2 further including a diamond or silicon carbide insulation layer 214 as taught by the present invention. The diamond insulation layer 214 is deposited, in accordance with any of the aforementioned methods, in a blanket layer at the surface of the semiconductor structure and at sufficient depth to form a planar layer with the top surface of the gate 306. Deposition to a greater depth, followed by planarization to expose the gate, is preferable to ensure a planar surface for the diamond insulation layer. It is here to be noted that the use of a diamond-like material, such as silicon carbide, which is more readily etched back, may be preferable here. A diamond or diamond-like material insulation layer, like layer 214, will aid in conducting heat laterally away from the devices and will channel that heat toward the thermal conduction paths 210 and out through bulk silicon 201 and/or toward a metal interconnect and via thermal conduction path (not shown) formed above the device (as taught in the prior art, for example, the Joshi, et al patent and patent application cited above). A diamond insulation layer may alternatively be provided on the top surface of a semiconductor structure with devices which have been formed in bulk silicon, as opposed to the illustrated SOI embodiment. While devices formed on bulk silicon generally do not suffer the extreme adverse thermal effects experienced by devices formed in an SOI structure, a lateral thermal conduction path provided by a diamond insulation film may be increasingly necessary as device dimensions continue to shrink.

Figure 6A:
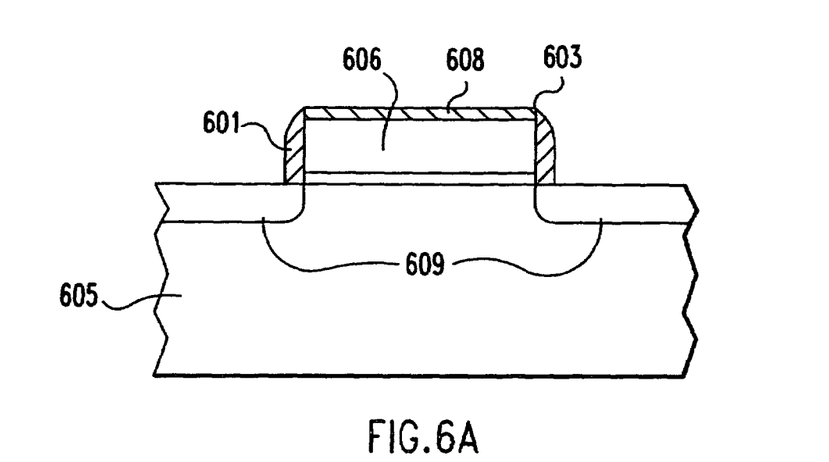
FIGS. 6A through 6B illustrate embodiments of the present invention including diamond sidewall spacers.

FIGS. 6A provides an illustration of a further alternative embodiment of the present invention wherein diamond sidewall spacers are provided to the gate structure to direct heat away from the gate through the device junctions formed in substrate 605. CVD diamond sidewall spacers 601 and 603 are formed over a thermal oxide layer 608 along the sidewalls of gate 606. The preferred method for forming the sidewalls is to blanket deposit a diamond layer and etch back the diamond in oxygen plasma with an anisotropic etch. A pair of sidewall spacers would be formed on both sides of the gate, since the plasma will not etch anything other than the diamond. Once the sidewall spacers have been formed, they will facilitate conduction of heat away from the gate and through the source and drain junction areas 609. Thermal oxide layer 608 provides the necessary barrier between the active device regions and the deposited diamond material, much like the protective oxide from the thermal oxidation step discussed above with reference to FIGS. 3A through 3G.

Figure 6B:
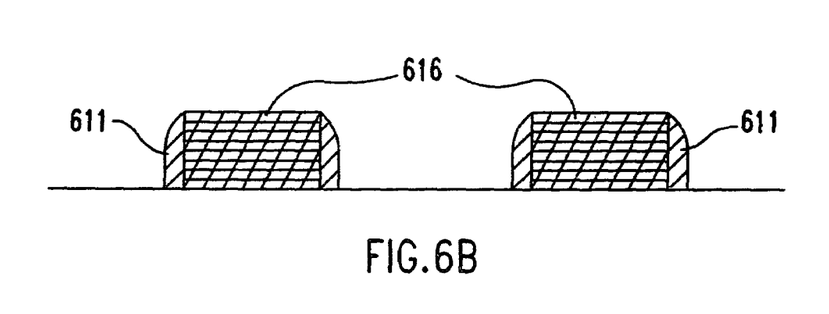
Figure 6C:
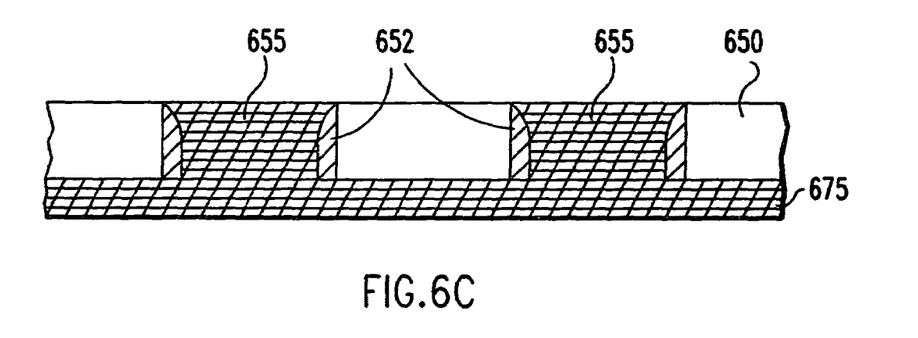

The sidewall spacer embodiment can be implemented on either bulk silicon or SOI structures. Moreover, the sidewall spacers can be used for providing cooling for structures other than the gate of a transistor as illustrated in FIG. 6A. Highly resistive polysilicon resistors and surface wiring are structures for which a sidewall spacer could provide cooling. FIG. 6B illustrates the use of sidewall spacers 611 disposed along the sidewalls of metal wiring 616 at the substrate surface. Yet another embodiment is illustrated in FIG. 6C wherein diamond sidewall spacers 652 are disposed along the sides of openings in dielectric layer 650, into which metal interconnects 655 are deposited to contact the metal underlayer 675.

Figure 7A:
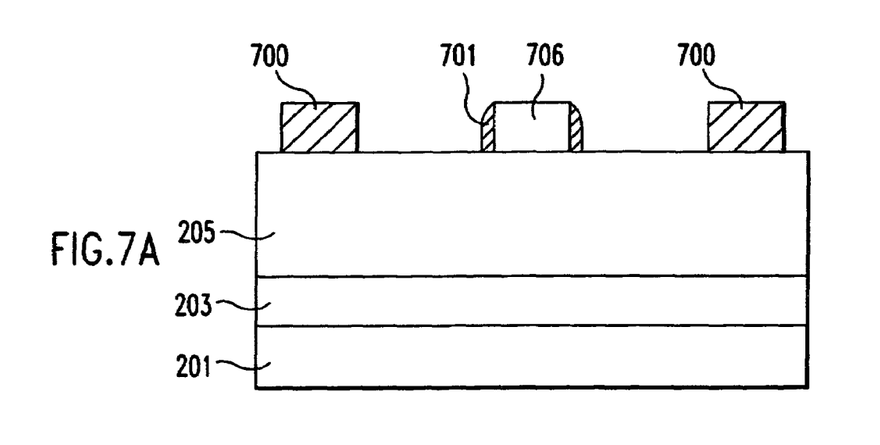
FIGS. 7A through 7F show processing steps for providing inventive diamond cooling structures using a diamond layer for self-aligned device fabrication.
Figure 7B:
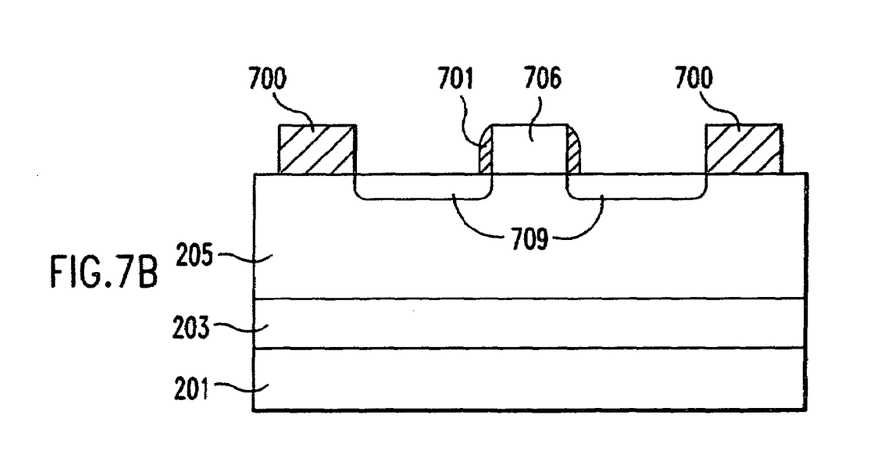
Figure 7C:
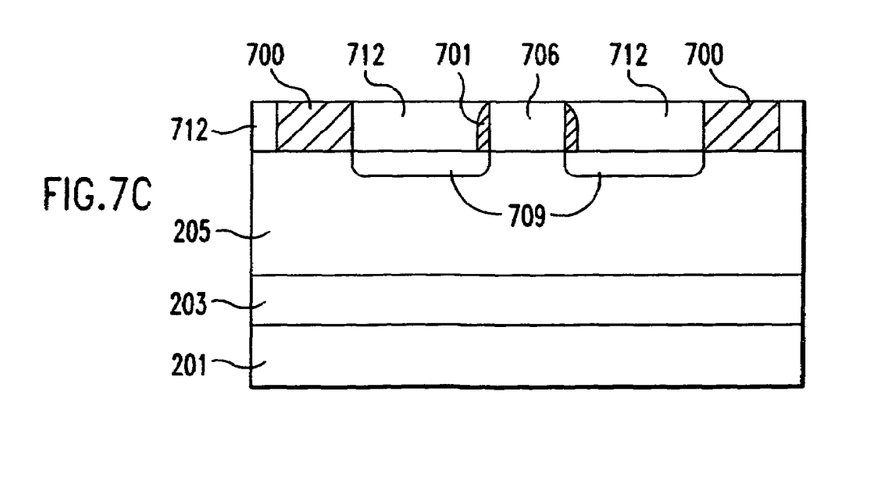
Figure 7D:
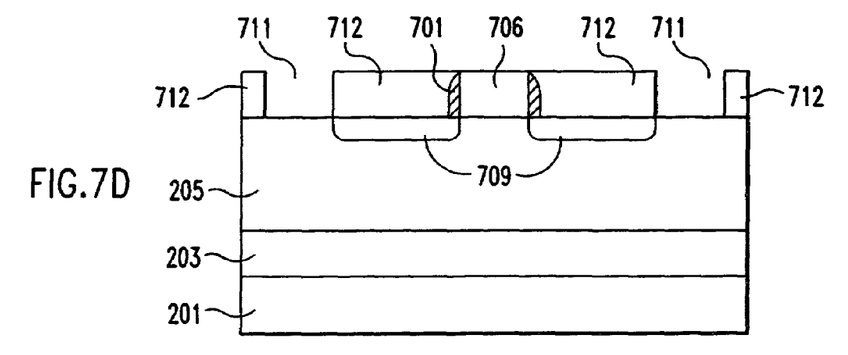
Figure 7E:
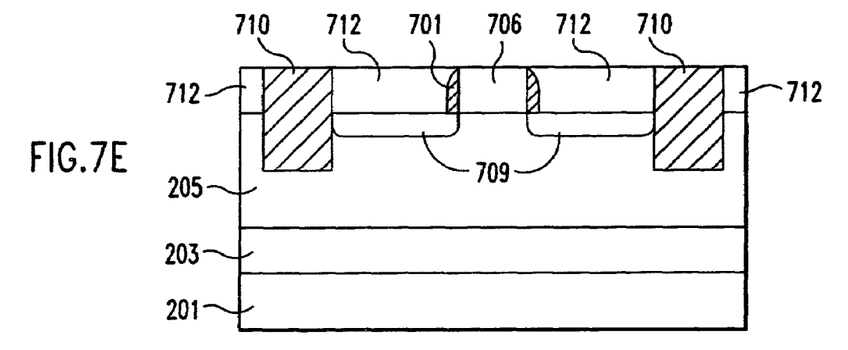
Figure 7F:
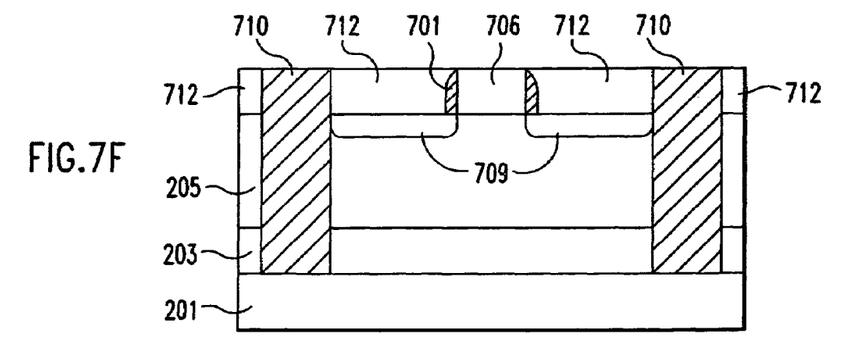

FIGS. 7A through 7F show processing steps for providing inventive diamond cooling structures using a diamond layer for self-aligned device, specifically transistor, fabrication on a silicon substrate which includes top silicon layer 205, buried oxide layer 203 and underlying bulk silicon 201. As depicted in FIG. 7A, after formation of gate 706, a blanket layer of diamond is deposited and patterned, leaving diamond features 700 at the substrate surface and diamond sidewall spacers 701 along the sidewalls of gate 106. The diamond features 700 which remains at the surface are disposed over those areas which have been designated to include isolation regions between devices. It is to be noted that the sidewall spacers 701 could be formed in a separate series of steps whereby either diamond or another dielectric material could be deposited over gate 706 and diamond features 700 and then etched back, leaving sidewall spacers 701 along the gate sidewalls, and sidewall spacers (not shown) along the sidewalls of the diamond features 700 is well. After formation of the sidewalls, using the diamond as a self-aligned mask, the source and drain regions 709 are implanted, as shown in FIG. 7B. Next, a dielectric layer 712, such as silicon nitride, is deposited as shown in FIG. 7C. The diamond 700 is removed from the substrate surface, as shown in FIG. 7D, and etching into the substrate is conducted to form the trenches 711 into which diamond will be deposited to form the cooling structures. FIG. 7E shows a finished cooling structure wherein shallow trench regions have been opened, by removal of diamond 700 and etching into silicon top layer 205, followed by deposition of diamond into the shallow trench regions to form isolation and cooling structures 710. Alternatively, FIG. 7F shows a finished cooling structure wherein deep trench regions have been opened, by removal of diamond 700 and etching through silicon top layer 205, through buried oxide layer 203 and into contact with underlying silicon 201, followed by deposition of diamond into the deep trench regions to form isolation and cooling structures 715.

Figure 8A:
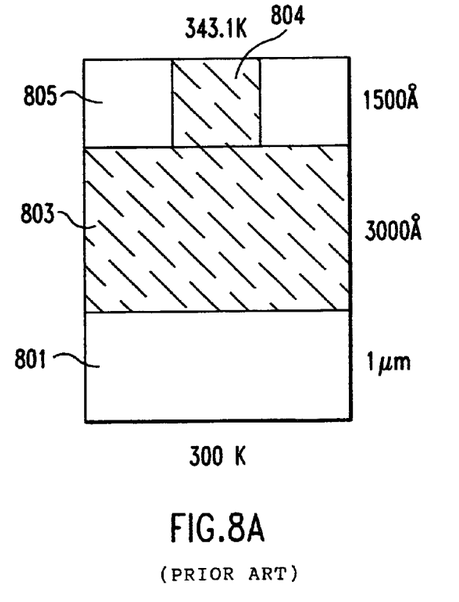
FIGS. 8A and 8B provide illustration of a thermal analysis conducted of semiconductor structures formed in accordance with the prior art and the present invention, respectively.
Figure 8B:
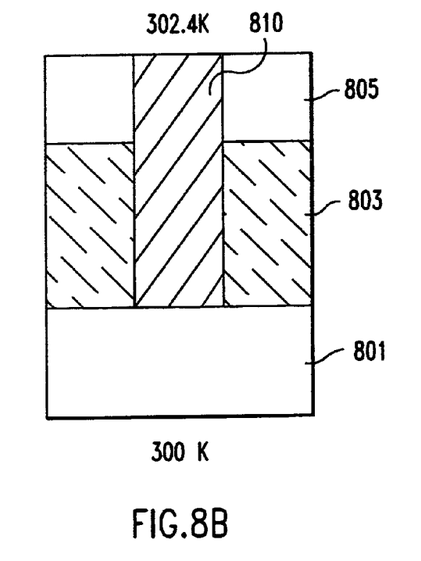

FIGS. 8A and 8B provide illustration of a thermal analysis conducted on two semiconductor structures, a prior art structure and the structure of the present invention, respectively. The structure of FIG. 8A includes a silicon dioxide region 804 formed in a 1500 Å silicon layer 805 disposed above a 3000 Å buried oxide layer 803 with 1 micron of underlying bulk silicon 801. The structure of FIG. 8B includes a CVD diamond region 810 formed in 30% of the 1500 Å silicon layer 805 and extending through the 3000 Å buried oxide layer 803 to contact the 1 micron of underlying bulk silicon 801. Under the same thermal conditions, the thermal analysis shows that the junction temperature for the structure having a silicon dioxide region 804 was 343.1° K., while the junction temperature for the structure having a CVD diamond insulator region 810 was 302.4° K. Clearly, the CVD diamond region provided a dramatic reduction of temperature at the junction by dissipating the heat through the structure. It is asserted that even the relatively small area of diamond provided in the sidewall spacer embodiment will provide roughly 20× the heat dissipation of that realized by a spacer made of silicon dioxide.

While the present invention has been described with reference to several preferred materials and structures, modifications by one skilled in the art cannot be made without departing from the spirit and scope of the invention as set forth in the appended claims.

The invention claimed is:
1. A method for providing cooling with respect to at least one semiconductor device formed in a silicon substrate comprising the steps of:
providing at least one diamond-filled trench adjacent to the at least one semiconductor device; and
conducting heat from the at least one semiconductor device along the trench,
wherein at least one semiconductor device comprises a transistor having a source region and a drain region formed in the silicon substrate and a gate formed at the top of the silicon substrate in contact with the source and drain regions and wherein said providing at least one diamond-filled trench adjacent to the at least one semiconductor device comprises the steps of:
after fabrication of at least one gate at the substrate surface, one gate for each of said at least one transistor, depositing a blanket layer of diamond adjacent the at least one gate;
patterning the blanket layer of diamond to obtain a patterned diamond layer having a plurality of diamond mask features and at least two patterned regions adjacent to said at least one gate;
forming the source and drain regions of said at least one transistor through said at least two patterned regions;
removing said plurality of diamond mask features from the substrate surface to form a plurality of mask feature openings;
etching into said substrate in the plurality of mask feature openings to form a plurality of trenches; and
filling the plurality of trenches with diamond; and
further comprising forming a first diamond sidewall spacer at a first gate sidewall and in contact with the source region and forming a second sidewall spacer at the second gate sidewall and in contact with the drain region.

2. The method of claim 1 wherein said providing a diamond-filled trench comprises the steps of:
   etching a trench into the silicon substrate adjacent to the semiconductor device; and
   filling the trench with diamond.

3. The method of claim 2 wherein the filling of the trench with diamond comprises depositing the diamond by hot filament chemical vapor deposition using methane and hydrogen.

4. The method of claim 1 wherein a first diamond-filled trench is formed in contact with the source region and a second diamond-filled trench is formed in contact with the drain region.

5. A method for providing cooling with respect to at least one semiconductor device formed in a silicon substrate comprising the steps of:
   providing at least one diamond-filled trench adjacent to the at least one semiconductor device; and
   conducting heat from the at least one semiconductor device along the trench,
   wherein said at least one semiconductor device comprises at least one transistor and wherein said providing at least one diamond-filled trench adjacent to the at least one semiconductor device comprises the steps of:
   after fabrication of at least one gate at the substrate surface, one gate for each of said at least one transistor, depositing a blanket layer of diamond adjacent the at least one gate;
   patterning the blanket layer of diamond to obtain a patterned diamond layer having a plurality of diamond mask features and at least two patterned regions adjacent to said at least one gate;
   forming the source and drain regions of said at least one transistor through said at least two patterned regions;
   removing said plurality of diamond mask features from the substrate surface to form a plurality of mask feature openings;
   etching into said substrate in the plurality of mask feature openings to form a plurality of trenches; and
   filling the plurality of trenches with diamond.

6. The method of claim 5 wherein said filling comprises depositing diamond by chemical vapor deposition from methane and hydrogen gases.

7. The method of claim 5 wherein said silicon substrate comprises a top silicon layer, a buried oxide layer disposed beneath the top silicon layer and a bulk silicon region disposed below the buried oxide region and wherein said etching comprises etching through said top silicon layer and through said buried oxide layer to contact the bulk silicon region.

8. A method for fabricating a semiconductor structure having thermal cooling from a silicon substrate comprising the steps of:
   forming a plurality of devices in said silicon substrate;
   depositing a blanket layer of diamond on said silicon substrate after fabrication of said plurality of devices;
   patterning the blanket layer of diamond to form a plurality of mask openings in said blanket layer, said openings being disposed between said devices;
   etching a plurality of openings in said silicon substrate, through said mask openings of said blanket layer, said openings being disposed between said devices; and
   filling said plurality of openings with diamond, wherein the devices comprise transistors, each transistor having a source region and a drain region formed in the top silicon layer and a gate region formed on the top surface of the top silicon layer in contact with the source and drain regions, wherein the method further comprises the step of forming diamond sidewall spacers at the sidewalls of each of the gates.

9. The method of claim 8 wherein said filling comprises depositing diamond by chemical vapor deposition from methane and hydrogen gases.

10. The method of claim 8 further comprising forming a plurality of shallow trench isolation regions prior to forming said devices, wherein one shallow trench isolation region is disposed between each pair of adjacent devices.

11. The method of claim 8 wherein said silicon substrate comprises a top silicon layer, a buried oxide layer disposed beneath the top silicon layer and a bulk silicon region disposed below the buried oxide region and wherein said etching comprises etching through said top silicon layer and through said buried oxide layer to contact the bulk silicon region.

12. The method of claim 8 further comprising depositing a diamond insulation layer between the gates of the transistors directly at the top surface of the silicon substrate after formation of said gates.

13. The method of claim 11 further comprising depositing a diamond insulation layer between devices directly at the top surface of the silicon substrate after formation of said devices.

* * * * *